US012687729B2

(12) United States Patent
Quan et al.

(10) Patent No.: US 12,687,729 B2
(45) Date of Patent: Jul. 21, 2026

(54) HEAD-MOUNTED DISPLAY DEVICE AND COMMUNICATION COMMAND SYSTEM

(71) Applicant: BOE TECHNOLOGY GROUP CO., LTD., Beijing (CN)

(72) Inventors: Xudong Quan, Beijing (CN); Lili Chen, Beijing (CN); Haoran Jing, Beijing (CN); Zheng Ge, Beijing (CN); Chao Zheng, Beijing (CN); Feng Gao, Beijing (CN); Weihua Du, Beijing (CN); Feng Zi, Beijing (CN); Chaoquan Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/995,262

(22) PCT Filed: Feb. 6, 2024

(86) PCT No.: PCT/CN2024/076316
§ 371 (c)(1),
(2) Date: Jan. 16, 2025

(87) PCT Pub. No.: WO2024/193255
PCT Pub. Date: Sep. 26, 2024

(65) Prior Publication Data
US 2026/0016698 A1 Jan. 15, 2026

(30) Foreign Application Priority Data
Mar. 23, 2023 (CN) .......................... 202310293628.4

(51) Int. Cl.
*G02B 27/01* (2006.01)
*G06F 3/01* (2006.01)
(Continued)

(52) U.S. Cl.
CPC ......... *G02B 27/0176* (2013.01); *G02B 27/01* (2013.01); *G02B 27/017* (2013.01);
(Continued)

(58) Field of Classification Search
CPC .............. G02B 27/017; G02B 27/0172; G02B 27/0176; G02B 2027/0138;
(Continued)

(56) References Cited

U.S. PATENT DOCUMENTS

2023/0204958 A1* 6/2023 Fliszar ..................... G06F 3/013
345/8
2024/0103282 A1* 3/2024 Law ........................ G02C 5/126

FOREIGN PATENT DOCUMENTS

CN 1128474 A 8/1996
CN 106059012 A 10/2016
(Continued)

OTHER PUBLICATIONS

Office Action dated Jul. 26, 2025, issued in counterpart CN Application No. 202310293628.4, with English translation. (11 pages).

*Primary Examiner* — Cory A Almeida
(74) *Attorney, Agent, or Firm* — WHDA, LLP

(57) ABSTRACT

The present disclosure relates to a head-mounted display device, including: a head-mounted display portion, and a control portion in signal connection with the head-mounted display portion; the control portion includes a main battery, an auxiliary battery, and a switching circuit module connected to the main and auxiliary batteries. The switching circuit module is used for power supply switching between the main battery and the auxiliary battery, and includes a first trigger connector and a second trigger connector having a first state and a second state; in the first state, the first trigger connector and the second trigger connector are in an off-state, the main battery supplies power; in the second state, (Continued)

the first trigger connector and the second trigger connector are in an on-state to trigger a switching signal to switch to the auxiliary battery for power supply. The present disclosure further relates to a communication command system.

18 Claims, 8 Drawing Sheets

(51) Int. Cl.

| | | |
|---|---|---|
| *G06F 3/041* | (2006.01) | |
| *H02J 7/70* | (2026.01) | |
| *H02J 9/06* | (2006.01) | |
| *H04N 23/667* | (2023.01) | |
| *H05K 5/06* | (2006.01) | |

(52) U.S. Cl.
CPC ......... *G02B 27/0172* (2013.01); *G06F 3/013* (2013.01); *G06F 3/041* (2013.01); *H02J 7/70* (2026.01); *H02J 9/06* (2013.01); *H04N 23/667* (2023.01); *H05K 5/061* (2013.01); *G02B 2027/0138* (2013.01); *G02B 2027/014* (2013.01); *G02B 2027/0152* (2013.01); *G02B 2027/0156* (2013.01); *G02B 2027/0163* (2013.01); *G02B 2027/0178* (2013.01)

(58) Field of Classification Search
CPC ...... G02B 2027/014; G02B 2027/0152; G02B 2027/0156; G02B 2027/0163; G02B 2027/0178; G02B 27/01; H02J 9/06; H02J 7/70; G06F 3/013; G06F 3/041; H04N 23/667; H05K 5/061
See application file for complete search history.

(56) References Cited

FOREIGN PATENT DOCUMENTS

| | | | | |
|---|---|---|---|---|
| CN | 205882781 | U | | 1/2017 |
| CN | 106532902 | A | | 3/2017 |
| CN | 109920220 | A | * | 6/2019 |
| CN | 110401950 | A | | 11/2019 |
| CN | 110417108 | A | | 11/2019 |
| CN | 113341573 | A | | 9/2021 |
| CN | 114860857 | A | | 8/2022 |
| CN | 217606186 | U | * | 10/2022 |
| CN | 116594178 | A | | 8/2023 |

* cited by examiner

X 2-4-1

2-4

2-16

2-17

2-14

2-5-1

2-15

2-18

2-5

2-19

2-5-2

2-20

2-21

2-2

2-12-1

2-12-4

2-12

2-12-3

2-11-2

2-11

2-7

1-17

2-13

2-6

2-3

2-10

2-8

2-9

2-4

2-5

2-2

2-3

2-1

100

HEAD-MOUNTED DISPLAY DEVICE AND COMMUNICATION COMMAND SYSTEM

CROSS-REFERENCE TO RELATED APPLICATION

The present application is the U.S. national phase of PCT Application No. PCT/CN2024/076316 filed on Feb. 6, 2024, which claims the priority of Chinese Application No. 202310293628.4 filed on Mar. 23, 2023, the disclosure of which are incorporated in their entireties by reference herein.

TECHNICAL FIELD

The present disclosure relates to the field of manufacturing head-mounted display products, and in particular to a head-mounted display device and a communication command system.

BACKGROUND

Head-mounted display devices are a brand-new technology in modern display technology, and they have important applications in enhanced display, virtual realization, and stereoscopic display. Traditional head-mounted display devices are limited in application scenarios and have the following shortcomings: ① not supported for use in harsh outdoor environments; ② limited usage time; and ③ no night vision function.

SUMMARY

In order to solve the above technical problems, the present disclosure provides a head-mounted display device and a communication command system, which can solve the problem of limited usage time of head-mounted display devices.

In order to achieve the above object, the technical solution adopted by the embodiment of the present disclosure is: a head-mounted display device, including: a head-mounted display portion and a control portion connected to the head-mounted display portion by signal;

wherein the control portion includes a main battery, an auxiliary battery, and a switching circuit module connected to the main battery and the auxiliary battery; and the switching circuit module is used to switch power supply between the main battery and the auxiliary battery;

the switching circuit module includes a first trigger connector and a second trigger connector having a first state and a second state; in the first state, the first trigger connector and the second trigger connector are in an off-state, and the main battery supplies power; in the second state, the first trigger connector and the second trigger connector are in an on-state to trigger a switching signal to switch to the auxiliary battery for power supply.

Optionally, the switching circuit module includes an execution module, the first trigger connector and the second trigger connector; the main battery and the auxiliary battery are electrically connected to a power supply module of the control portion through the execution module to power the control module, and the first trigger connector is connected to the power supply module of the control portion;

in the second state, the second trigger connector is electrically connected with the first trigger connector to trigger a switching signal for switching the power supply from the main battery to the auxiliary battery; according to the switching signal, the power supply module sends a command to the execution module to perform power switching.

Optionally, the control portion includes a main housing for accommodating the control module and a battery compartment housing for accommodating the main battery and the auxiliary battery;

the switching circuit module includes a switching circuit board, and the execution module is integrated on the switching circuit board;

the first trigger connector includes an anti-foolproof switch, and the anti-foolproof switch is arranged on the main housing;

the second trigger connector includes a battery block and a conductive metal sheet; the battery block is movably connected to a through hole of a side wall of the battery compartment housing on a side close to the main housing; the conductive metal sheet is arranged on a side of the battery block close to the main housing;

under action of external force, the battery block moves toward a direction close to the anti-foolproof switch, thereby enabling the conductive metal sheet to be electrically connected to the anti-foolproof switch to trigger the switching signal that switches the power supply from the main battery to the auxiliary battery.

Optionally, the second trigger connector further includes a reset spring; the battery block is elastically connected to the main housing through the reset spring, and part of the battery block extends through the through hole in the battery compartment housing and is accommodated in the battery compartment housing; an orthographic projection of the conductive metal sheet onto the main housing at least partially covers the anti-foolproof switch.

Optionally, the battery compartment housing includes a first shell and a first cover plate that are engaged with each other to form a battery compartment; the main battery and the auxiliary battery are arranged in the battery compartment along a first direction;

the through hole is defined in the first cover plate; in the first direction, the battery block is arranged on a side of the main battery away from the auxiliary battery.

Optionally, in a second direction perpendicular to the first direction, the first cover plate has two opposite side edges, at least one of the side edges is provided with a reinforcing plate, and the reinforcing plate is arranged perpendicular to the first cover plate.

Optionally, the first shell includes a first sub-shell and a second sub-shell; the first sub-shell is fixedly connected to the first cover plate; the second sub-shell is movably connected to the first sub-shell and the first cover plate.

Optionally, the main housing includes a second shell and a second cover plate that are engaged with each other to form a receiving cavity; the control module is integrated on a main circuit board received in the receiving cavity;

a side wall of the second shell is provided with a plug interface for connecting to a signal connection line of the head-mounted display portion;

and/or, the side wall is provided with a volume button, a power switch button and a subscriber identification module (SIM) card installation slot;

and/or, a touch area is provided on an operation surface of the second shell away from the second cover plate;

and/or, the side wall or the operation surface is provided with an operation indicator light;

and/or, the side wall or the operation surface is provided with function selection buttons.

Optionally, the head-mounted display portion includes a head-mounted bracket, a display module and a camera module located in the head-mounted bracket;

the head-mounted bracket includes a glasses frame, two glasses arms, and a webbing 1-10 connected between ends of the two glasses arms away from the glasses frame.

Optionally, the camera module includes:

a camera with RGB camera mode and IR camera mode;

an illumination sensor for detecting external ambient light intensity;

a processor used to select a corresponding RGB camera mode or IR camera mode according to alight intensity detected by the illumination sensor.

Optionally, the camera module further includes: an infra-red fill light for performing infrared fill light in the IR camera mode.

Optionally, the head-mounted display portion further includes a diffraction light waveguide arranged in a light-emitting layer of the display module to form a viewpoint entering the pupil of the human eye, and the diffraction light waveguide is arranged in the glasses frame.

Optionally, the head-mounted display portion further includes a photochromic lens; the photochromic lens is arranged on a side of the diffraction optical waveguide away from the display module; the photochromic lens includes a first transparent conductive layer, an electrochromic material and a second transparent conductive layer stacked on each other; light transmittance of the electrochromic material changes with change of a voltage applied to the first conductive layer and the second conductive layer.

Optionally, the two glasses arms include a first glasses arm and a second glasses arm; a main driving board is arranged in the first glasses arm; the main driving board is connected to the control portion through a signal connection line; the main driving board is connected to a camera driving board of the camera module through a first adapter circuit board; the camera driving board is arranged in the second glasses arm; the main driving board is connected to a display drive board of the display module through a second adapter circuit board;

the eyeglass frame includes a first sub-frame and a second sub-frame stacked in a light emitting direction of the display module; the first sub-frame and the second sub-frame are interlocked to form an accommodating cavity; the first adapter circuit board and the second adapter circuit board are accommodated in the accommodating cavity, and one end of the first adapter circuit board extends into the first glasses arm to be connected to the main driving board, and one end of the second adapter circuit board extends into the first glasses arm to be connected to the main driving board.

Optionally, each of the glasses arms is pivotally connected to the eyeglass frame via a rotating shaft, thereby enabling the glasses arms to be flipped around a connection position with the eyeglass frame at a preset angle in a third direction; the third direction is a length direction of the eyeglass frame.

Optionally, a nose pad is provided in a middle of the eyeglass frame; the nose pad is U-shaped; the nose pad includes a memory alloy bracket and an elastic colloid coated on an outside of the memory alloy bracket.

One embodiment of the present disclosure further provides a communication command system, including: the above head-mounted display device and a command terminal; wherein the head-mounted display device and the command terminal are communicatively connected.

The beneficial effect of the present disclosure is that: by usage of dual batteries of the main battery and the auxiliary battery, when the main battery is replaced, it can be intelligently switched to the auxiliary battery for power supply, thereby indefinitely extending the use time.

DETAILED DESCRIPTION

In order to make objects, technical solutions and advantages of embodiments of the present disclosure more apparent, the technical solutions in the embodiments of the present disclosure will be described hereinafter in a clear and complete manner in conjunction with the accompanying drawings of the embodiments of the present disclosure. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, technical terms or scientific terms used in the present disclosure are intended to be understood in the ordinary meaning of the ordinary skill of the art. The words "first", "second" and similar terms used in the present disclosure do not denote any order, quantity, or importance, but are used to distinguish different components. Similarly, words such as "a", "an", or "the" do not denote a limitation of quantity, but rather denote the presence of at least one of referenced item. The words such as "including", "includes" mean that, an element or item preceding the word is intended to cover the element, or item, or equivalents thereof, which is listed after the word, instead of excluding other elements or items. The words "connect" or "connected" and the like are not limited to physical or mechanical connections, but may include electrical connections, whether direct or indirect. "Upper", "lower", "left", "right", etc. are only used to indicate the relative positional relationship, and when the absolute position of the described object is changed, the relative positional relationship may also be changed accordingly.

Figure 1:
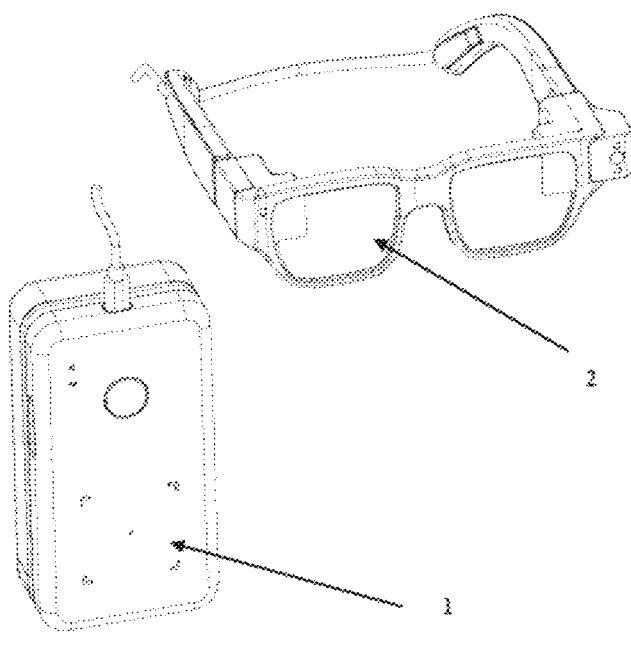
FIG. 1 is a schematic diagram of a head-mounted display device according to one embodiment of the present disclosure.
Figure 15:
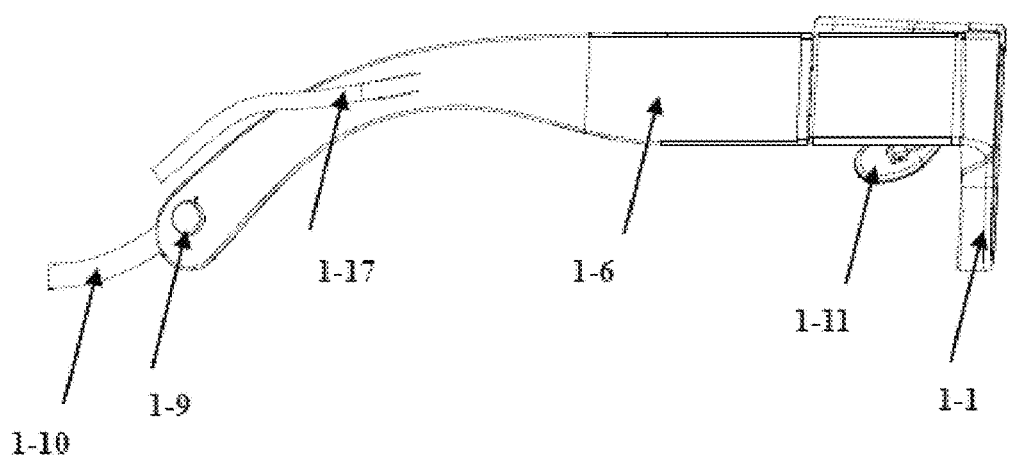
FIG. 15 is a second schematic diagram of a glasses arm according to one embodiment of the present disclosure.

Referring to FIG. 1 and FIG. 15, one embodiment provides a head-mounted display device, including a head-mounted display portion 2 and a control portion 1 connected to the head-mounted display portion 2 by signals.

The control portion 1 includes a housing and a control module located in the housing. The control module is connected to the head-mounted display portion 2 to realize functional operations including communication function, face recognition function and real-time storage function.

The control portion 1 further includes a main battery 2-17, an auxiliary battery 2-15, and a switching circuit module connected to the main battery 2-17 and the auxiliary battery 2-15. The switching circuit module is used to realize power supply switching between the main battery 2-17 and the auxiliary battery 2-15.

By usage of dual batteries of the main battery 2-17 and the auxiliary battery 2-15, when the main battery 2-17 is replaced, it can be intelligently switched to the auxiliary battery 2-15 for power supply; and after the main battery 2-17 is replaced, it can automatically switch to the main battery 2-17 for power supply, thereby indefinitely extending the use time.

Exemplarily, the auxiliary battery 2-15 is in a power supply state only when the main battery 2-17 is replaced. Generally, the time for replacing the main battery 2-17 is not long. Therefore, the replacement frequency of the auxiliary battery 2-15 is low, and the auxiliary battery 2-15 does not need to be replaced. However, in order to avoid the situation where the power of the auxiliary battery 2-15 is too low to supply power due to long-term use, the auxiliary battery 2-15 can be charged by the main battery 2-17. Exemplarily, the switching circuit module includes a detection unit for detecting the power of the auxiliary battery 2-15, and sending a signal when the power of the auxiliary battery 2-15 is lower than a preset value, and under control of a power supply module of the control portion 1, the main battery 2-17 charges the auxiliary battery 2-15.

Exemplarily, in order to realize the power supply switching between the main battery and the auxiliary battery, the switching circuit module includes a first trigger connector and a second trigger connector having a first state and a second state. In the first state, the first trigger connector and the second trigger connector are in an off-state, and the main battery supplies power. In the second state, the first trigger connector and the second trigger connector are in an on-state to trigger a switching signal to switch to the auxiliary battery for power supply.

It is to be noted that since the head-mounted display device is mainly powered by the main battery 2-17, the auxiliary battery 2-15 is only needed to supply power during the replacement of the main battery 2-17. Therefore, in some embodiments, after the first trigger connector and the second trigger connector are in the on-state to trigger the switching signal, the state of the first trigger connector and the second trigger connector will be converted to the first state.

In an exemplary embodiment, the switching circuit module includes an execution module, the first trigger connector and the second trigger connector. The main battery 2-17 and the auxiliary battery 2-15 are electrically connected to the power supply module of the control portion 1 through the execution module to power the control module, and the first trigger connector is connected to the power supply module of the control portion 1.

The first trigger connector and the second trigger connector are in an off-state in the first state; and in the second state, the second trigger connector can be electrically connected with the first trigger connector under the action of external force to trigger a switching signal for switching the power supply from the main battery 2-17 to the auxiliary battery 2-15. According to the switching signal, the power supply module sends a command to the execution module to perform power switching.

Referring to FIG. 2 to FIG. 8, in an exemplary embodiment, the control portion 1 includes a main housing for accommodating the control module and a battery compartment housing for accommodating the main battery 2-17 and the auxiliary battery 2-15.

The switching circuit module includes a switching circuit board 2-14, and the execution module is integrated on the switching circuit board 2-14.

The first trigger connector includes an anti-foolproof switch 2-21, and the anti-foolproof switch 2-21 is arranged on the main housing.

The second trigger connector includes a battery block 2-18 and a conductive metal sheet 2-19. The battery block 2-18 is movably connected to a through hole of a side wall of the battery compartment housing on a side close to the main housing. The conductive metal sheet 2-19 is arranged on a side of the battery block 2-18 close to the main housing.

Under the action of external force, the battery block 2-18 moves toward a direction close to the anti-foolproof switch 2-21, so that the conductive metal sheet 2-19 is electrically connected to the anti-foolproof switch 2-21, thereby triggering the switching signal that switches the power supply from the main battery 2-17 to the auxiliary battery 2-15.

Exemplarily, the second trigger connector further includes a reset spring 2-20. The battery block 2-18 is elastically connected to the main housing through the reset spring 2-20, and part of the battery block 2-18 extends through the through hole on the battery compartment housing and is accommodated in the battery compartment housing. An orthographic projection of the conductive metal sheet 2-19 onto the main housing at least partially covers the anti-foolproof switch 2-21.

The reset spring 2-20 is used to realize automatic rebound of the battery block 2-18, i.e., realizing automatic conversion of the first trigger connector and the second trigger connector from the second state to the first state.

Figures 2, 3:
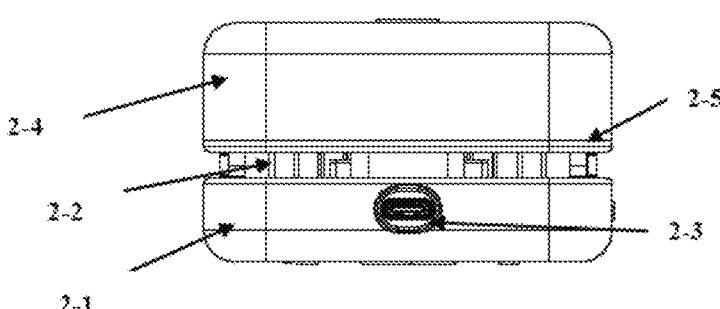
FIG. 2 is an exploded schematic diagram of a control portion according to one embodiment of the present disclosure.
FIG. 3 is a first schematic diagram of a control portion according to one embodiment of the present disclosure.

Referring to FIG. 2, in an exemplary embodiment, the battery compartment housing includes a first shell and a first cover plate 2-5 that are engaged with each other to form a battery compartment. The main battery 2-17 and the auxiliary battery 2-15 are arranged in the battery compartment along a first direction (referring to an X direction of FIG. 2).

The through hole is defined in the first cover plate 2-5. In the first direction, the battery block 2-18 is arranged on a side of the main battery 2-17 away from the auxiliary battery 2-15.

In an exemplary embodiment, in a second direction perpendicular to the first direction, the first cover plate 2-5 has two opposite side edges, at least one of the side edges is provided with a reinforcing plate 2-5-1, and the reinforcing plate 2-5-1 is arranged perpendicular to the first cover plate 2-5.

The first shell has a U-shaped structure. When the main battery 2-17 and the auxiliary battery 2-15 are accommodated in the battery compartment, the reinforcing plate is arranged on a periphery of the main battery 2-17 and/or the auxiliary battery 2-15, and the reinforcing plate cooperates with the side wall of the first shell to increase the strength of the side wall of the first shell.

The number of reinforcing plates 2-5-1 can be set according to actual needs. In the drawings of this embodiment, each of the side edges is provided with a reinforcing plate 2-5-1, and three reinforcing plates 2-5-1 are arranged at intervals on each side edge along the first direction, which is not limited thereto.

Figure 7:
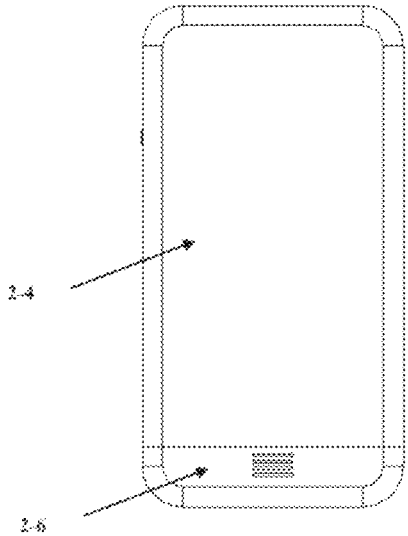
FIG. 7 is a fifth schematic diagram of a control portion according to one embodiment of the present disclosure.
Figure 8:
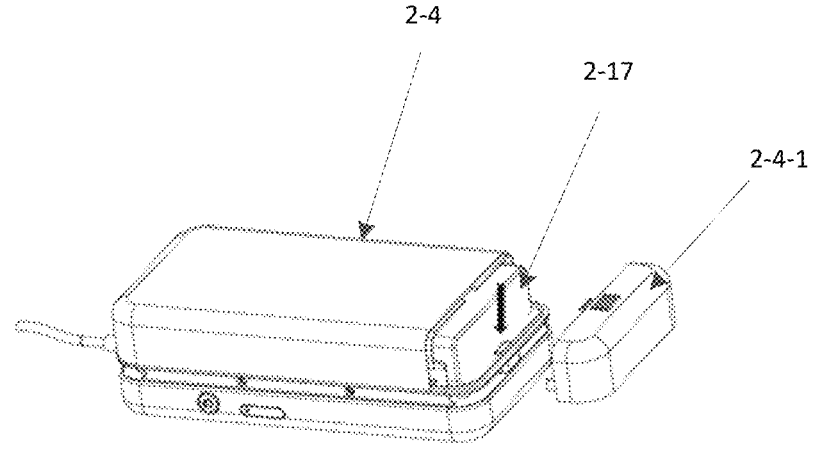
FIG. 8 is a sixth schematic diagram of a control portion according to one embodiment of the present disclosure.
Figure 9:
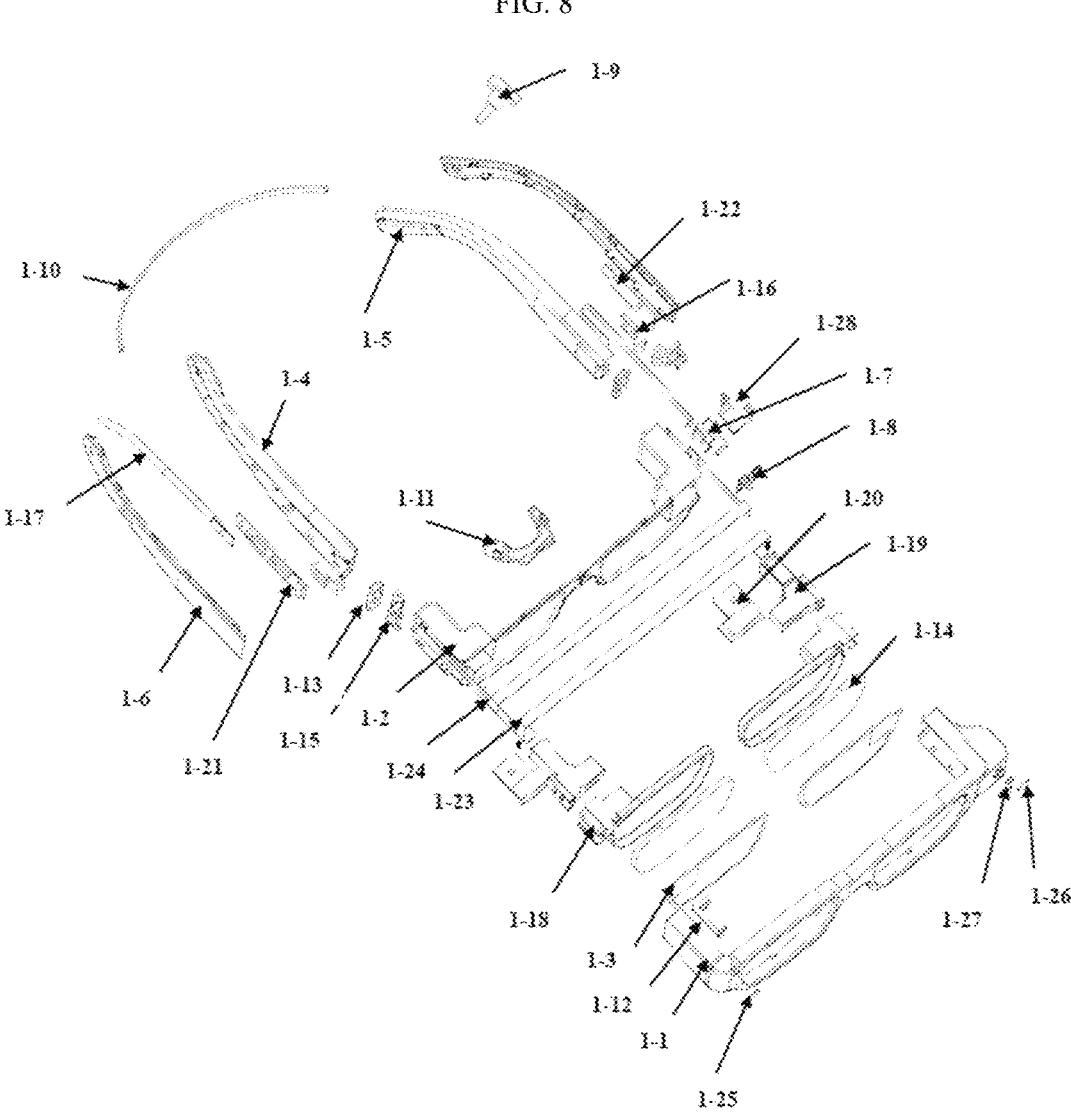
FIG. 9 is an exploded schematic diagram of a head-mounted display portion according to one embodiment of the present disclosure.
Figure 10:
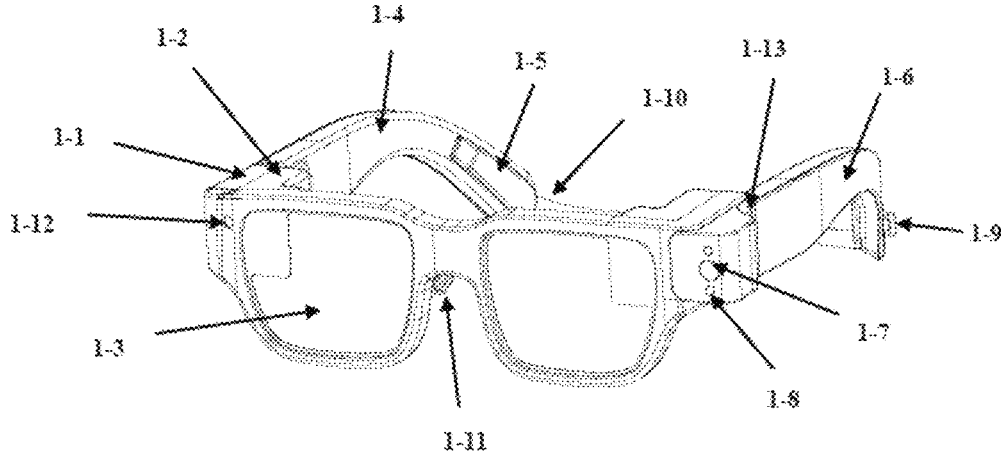
FIG. 10 is a first schematic diagram of a head-mounted display portion according to one embodiment of the present disclosure.
Figure 11:
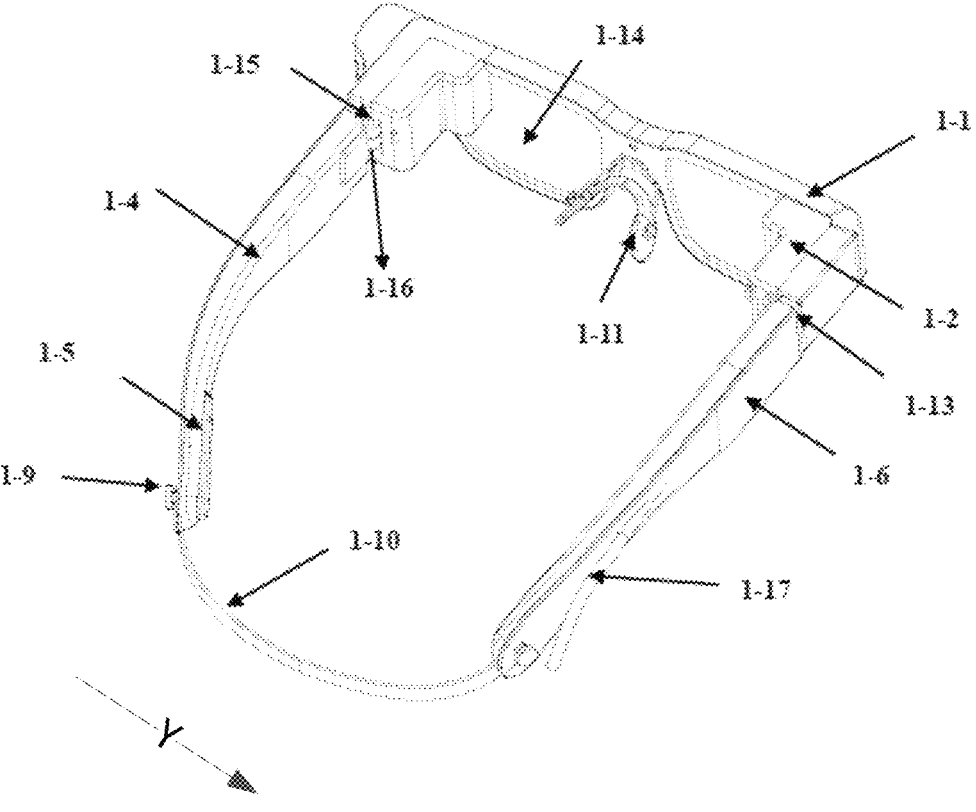
FIG. 11 is a second schematic diagram of a head-mounted display portion according to one embodiment of the present disclosure.
Figure 12:
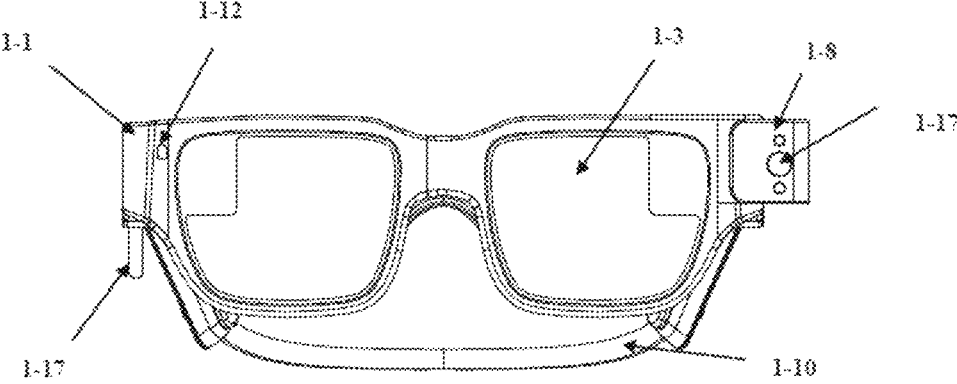
FIG. 12 is a third schematic diagram of a head-mounted display portion according to one embodiment of the present disclosure.
Figure 13:
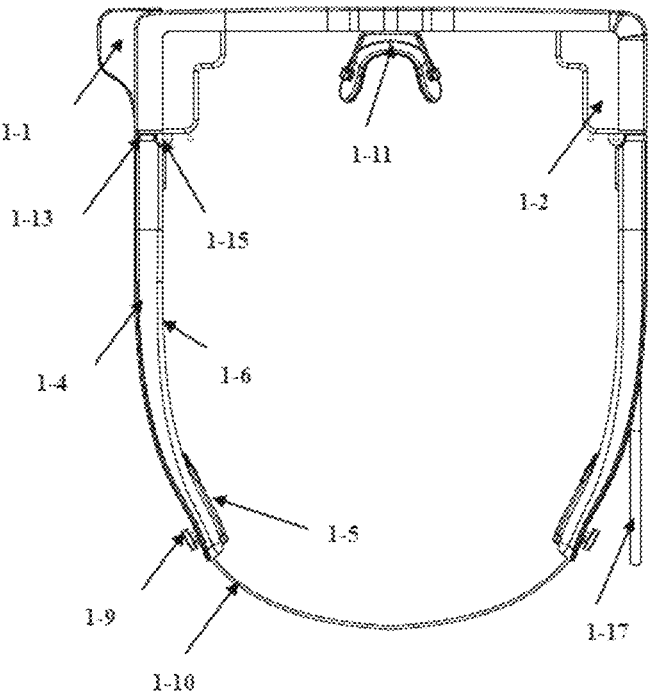
FIG. 13 is a fourth schematic diagram of a head-mounted display portion according to one embodiment of the present disclosure.
Figure 14:
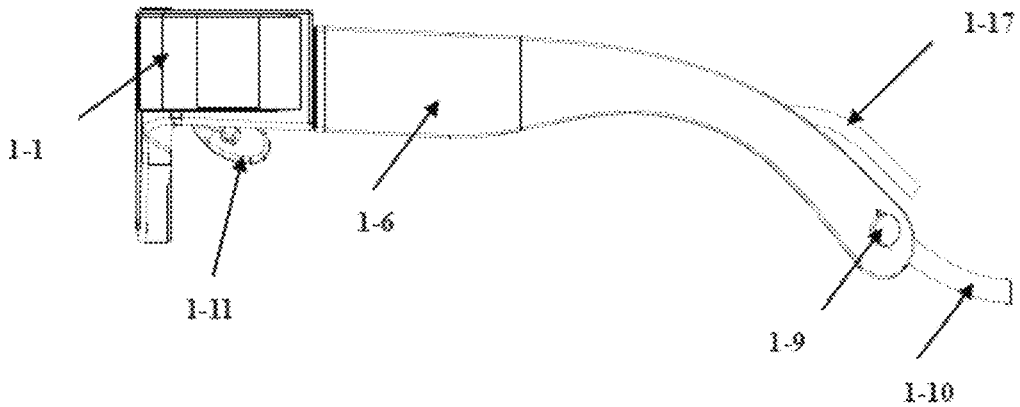
FIG. 14 is a first schematic diagram of a glasses arm according to one embodiment of the present disclosure.

Referring to FIG. 2, FIG. 7 and FIG. 8, in an exemplary embodiment, the first shell includes a first sub-shell 2-4 and a second sub-shell 2-4-1. The first sub-shell 2-4 is fixedly connected to the first cover plate 2-5. The second sub-shell 2-4-1 is movably connected to the first sub-shell 2-4 and the first cover plate 2-5. The second sub-shell 2-4-1 is slidably arranged relative to the first sub-shell 2-4. When the main battery 2-17 needs to be replaced, the second sub-shell 2-4-1 is slid to remove the second sub-shell 2-4-1, and the main battery 2-17 can be replaced. FIG. 8 is a schematic diagram of sliding away the second sub-shell 2-4-1. After sliding away the second sub-shell 2-4-1, the battery block 2-18 is pressed down so that the conductive metal sheet 2-19 is electrically connected to the anti-foolproof switch 2-21, to send a signal for switching the power supply battery to the auxiliary battery 2-15.

A first protrusion 2-5-2 is provided on the side of the first cover plate 2-5 away from the first shell. The first protrusion 2-5-2 is formed by extending a portion of the side edge in a direction away from the first shell, and the first protrusion 2-5-2 is provided perpendicular to the first cover plate 2-5. A first screw hole is defined in the first protrusion 2-5-2. A second protrusion corresponding to the first protrusion 2-5-2 is provided on the side wall of the first shell. A second screw hole is defined in the second protrusion to cooperate with the first screw hole for a bolt to extend through.

Referring to FIG. 2 to FIG. 6, in an exemplary embodiment, the main housing includes a second shell 2-6 and a second cover plate 2-2 that are engaged with each other to form a receiving cavity. The control module is integrated on a main circuit board 2-12 received in the receiving cavity. The power supply module is integrated on the switching circuit board 2-14 or is integrated on the main circuit board 2-12.

Figure 4:
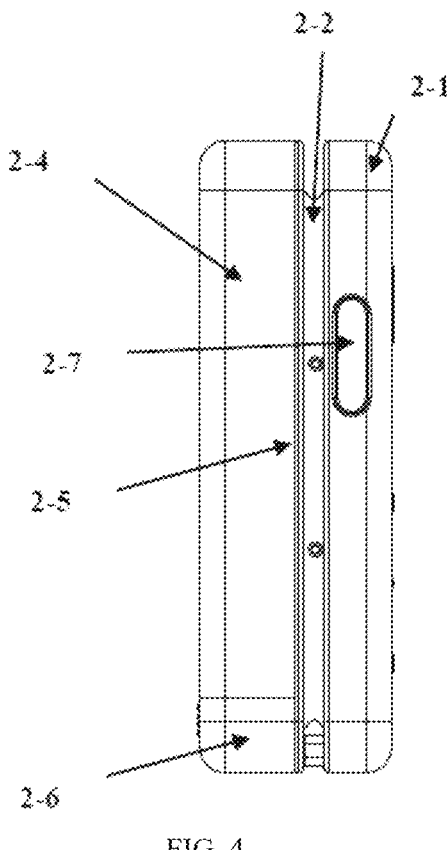
FIG. 4 is a second schematic diagram of a control portion according to one embodiment of the present disclosure.
Figure 5:
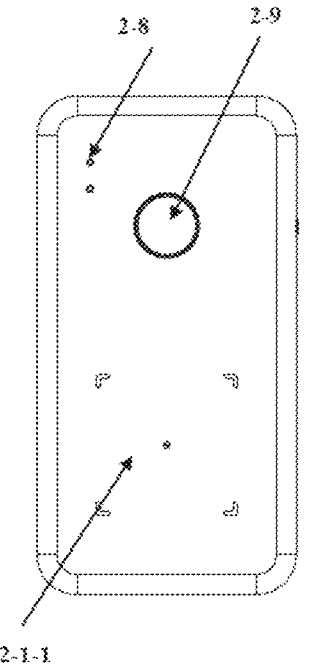
FIG. 5 is a third schematic diagram of a control portion according to one embodiment of the present disclosure.
Figure 6:
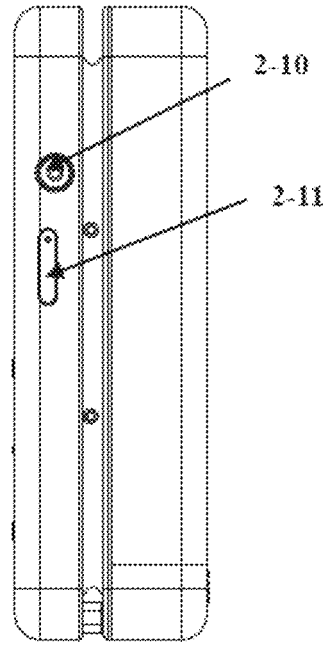
FIG. 6 is a fourth schematic diagram of a control portion according to one embodiment of the present disclosure.

The side wall of the second shell 2-6 is provided with a plug interface 2-12-4 for connecting to a signal connection line 1-17 of the head-mounted display portion 2;

and/or, the side wall is provided with a volume button 2-7, a power switch button 2-10 and a subscriber identification module (hereinafter referred to as SIM) card installation slot 2-12-3, referring to FIG. 2, FIG. 4 and FIG. 6;

and/or, a touch area 2-1-1 is provided on an operation surface of the second shell 2-6 away from the second cover plate 2-2, referring to FIG. 5;

and/or, the side wall or the operation surface is provided with an operation indicator light 2-8, referring to FIG. 2 and FIG. 5;

and/or, the side wall or the operation surface is provided with function selection buttons 2-9, referring to FIG. 5.

Exemplarily, the control portion 1 further includes a touch substrate 2-13 connected to the main circuit board 2-12, and a touch surface of the touch substrate 2-13 is arranged in the touch area 2-1-1.

It is to be noted that the volume button 2-7, the power switch button 2-10 and the SIM card installation slot 2-12-3 are arranged on the side wall, which conforms to the user's usage habits and is convenient for use, but is not limited to this.

The head-mounted display device in this embodiment has functions such as long-distance face recognition, real-time audio and video communication, law enforcement recording, remote command, etc. It can be applied to patrol, security, law enforcement recording, remote command, etc. Function selection can be performed through the function selection buttons 2-9.

It is to be noted that, in this embodiment, the selection of functions, adjustment of volume, etc. can be achieved through mechanical buttons or through voice control, and the control portion 1 includes a voice interaction module.

In this embodiment, the connection between the control portion 1 and the head-mounted display portion 2 is a wired connection. In an exemplary implementation, a plug-in anti-loosening rubber sleeve 2-3 is provided in the plug interface 2-12-4 to play a role of waterproof protection, referring to FIG. 2 and FIG. 3.

In an exemplary embodiment, a card holder sleeve 2-11 is provided in the SIM card installation slot 2-12-3 to provide waterproof protection.

In an exemplary embodiment, the second cover plate 2-2 is a heat dissipation cover plate, which is used to achieve heat dissipation of the control module. Exemplarily, the heat dissipation cover plate can be a metal plate, such as an aluminum plate, but is not limited thereto.

In an exemplary embodiment, a sealing ring 2-16 is used to seal the main housing and the battery compartment housing, referring to FIG. 2, which is waterproof and dustproof, and supports use in various harsh environments such as outdoor.

An assembly process of the control portion is as follows.

First, the volume button 2-7, indicator light 2-8, function selection button 2-9, power switch button 2-10, plug-in anti-loosening rubber sleeve 2-3 and touch substrate 2-13 are installed at corresponding positions of the main housing 2-1 and fixed with waterproof adhesive.

The main circuit board 2-12 is fixed on the main housing 2-1 and the position of the main circuit board 2-12 is adjusted so that all buttons function normally, and an antenna on the main circuit board is attached on a flat position of the main housing 2-1.

The heat dissipation cover plate (i.e., the second cover plate 2-2) is fastened to the main housing 2-1 by screws, and a power line of the main circuit board is led out through the hole in the heat dissipation cover plate. Then, gap between the heat dissipation cover plate and the main housing 2-1 is sealed with waterproof glue, and then the main housing is assembled.

The switching circuit board 2-14 and the auxiliary battery are fixed on the battery compartment housing, and the power line extends through the hole of the first cover plate 2-5 to connect with the switching circuit board 2-14.

The sealing ring 2-16 is placed on the first cover plate 2-5 and is fasten to the battery compartment housing, and at the same time the main battery 2-17 is installed into the battery compartment.

The conductive metal sheet 2-19 and the reset spring 2-20 are installed at the corresponding positions of the battery block 2-18 respectively, and the battery block 2-18 is placed at the corresponding position of the battery compartment.

The foolproof switch 2-21 is attached into a groove of the heat dissipation cover and is connected to the main circuit board 2-12.

Finally, the battery compartment housing and the main housing are assembled together, and the control portion is assembled.

Referring to FIG. 1, FIG. 9 to FIG. 15, in an exemplary embodiment, the head-mounted display portion includes a head-mounted bracket, a display module and a camera module located in the head-mounted bracket.

The head-mounted bracket includes a glasses frame, two glasses arms, and a webbing 1-10 connected between ends of the two glasses arms away from the glasses frame.

The presence of the webbing 1-10 can prevent the glasses from falling off during movement, and can also balance the weight of the entire device and relieve the stress on the nose.

The webbing 1-10 is fixedly connected between the two glasses arms via a webbing fixing knob 1-9. It is to be noted that the webbing 1-10 is wound around the webbing fixing knob 1-9, and a length of the webbing 1-10 can be adjusted by rotating the webbing fixing knob 1-9.

It is to be noted that the control portion 1 and the head-mounted display portion 2 can be set independently or separately. In some embodiments, to reduce weight, it is preferred that the control portion 1 and the head-mounted display portion 2 are set separately.

In the implementation way the control portion 1 and the head-mounted display portion 2 are separately arranged, the connection mode between the control portion 1 and the head-mounted display portion 2 can be a wired connection or a wireless connection. In some implementation manners, to simplify the structure and improve the communication performance, a wired connection is adopted between the control portion 1 and the head-mounted display portion 2, but it is not limited to this.

In an exemplary embodiment, the camera module includes:

a camera 1-7 with RGB camera mode and IR camera mode;

an illumination sensor 1-12 for detecting external ambient light intensity;

a processor used to select a corresponding RGB camera mode or IR camera mode according to alight intensity detected by the illumination sensor 1-12.

It is to be noted that RGB is a color mode, representing Red, Green, and Blue respectively, and is the most widely used color mode. IR is Infrared, which has a longer wavelength (about 760 nm~1 mm) than red light and is invisible light. In dim light conditions, the IR camera mode is used to enhance the reality effect. In this embodiment, the camera 1-7 integrates two camera modes, RGB camera mode and IR camera mode, so that the head-mounted display device has daylight and low-light night vision functions, and is suitable for strong light and low-light environments indoors and outdoors.

Exemplarily, the processor selects the corresponding RGB camera mode or IR camera mode according to the light intensity detected by the illuminance sensor 1-12, and the light intensity value ranges corresponding to the RGB camera mode and the IR camera mode can be set according to actual needs. In some embodiments, when the light intensity detected by the illuminance sensor 1-12 is less than 50 LUX, the camera module is in the IR camera mode, and when the light intensity detected by the illuminance sensor 1-12 is greater than 50 LUX, the camera module is in the RGB camera mode.

In an exemplary embodiment, the camera module further includes an infrared fill light 1-8 for performing infrared fill light in the IR camera mode. The presence of the infrared fill light 1-8 is to enhance the infrared night vision capability of the camera module in the IR camera mode.

It is to be noted that the power of the infrared fill light 1-8 can be set according to actual needs. The power of the infrared fill light 1-8 determines its fill light capability and determines the night vision distance of the camera module.

It is to be noted that, in the IR camera mode, not only can the head-mounted display portion have a low-light night vision function, but it is also not easily detected by the suspect.

In an exemplary embodiment, the head-mounted display portion 2 further includes a diffraction light waveguide 1-14 arranged in a light-emitting layer of the display module to form a viewpoint entering the pupil of the human eye, and the diffraction light waveguide 1-14 is arranged in the glasses frame.

In an exemplary embodiment, the display module includes a display substrate 1-19, a backlight structure, a display driving board 1-20, and an optical lens located at the light-emitting side of the display substrate 1-19. The optical lens is used to allow the light emitted from the display substrate to be incident on a coupling region of the diffraction light waveguide 1-14.

Exemplarily, the display substrate can be a liquid crystal display (LCD) screen, an organic light-emitting diode (OLED) display screen, an active matrix quantum dot light-emitting diode (QLED) display screen, a light-emitting diode (LED) display screen, or a liquid crystal on silicon (LCOS) display screen, or any other screen with a display function.

The LCOS display screen is characterized by ultra-high brightness and ultra-high definition, and is the best choice for high-end AR glasses optical modules. Therefore, in some implementations, the display screen is an LCOS display screen, but is not limited to this.

In an exemplary embodiment, the head-mounted display portion 2 further includes a photochromic lens 1-3. The photochromic lens 1-3 is arranged on a side of the diffraction optical waveguide 1-14 away from the display module. The photochromic lens 1-3 includes a first transparent conductive layer, an electrochromic material and a second transparent conductive layer stacked on each other. The light transmittance of the electrochromic material can change with the change of the voltage applied to the first conductive layer and the second conductive layer.

By inputting different voltages to the first conductive layer and the second conductive layer to control the transmittance of the photochromic lenses 1-3, an input voltage can be adjusted in real time according to the illumination of the external environment, thereby achieving the effect of improving the display effect of the display module. For example, in an outdoor strong light environment (for example, the light intensity is greater than 100 LUX), to avoid strong light stimulation, the color of the photochromic lenses will deepen (like sunglasses) and the transmittance will decrease to enhance the display effect, so that the user can obtain a clear image of the outside world. In an indoor environment (for example, the light intensity is less than 100 LUX, the photochromic lenses are in a transparent state.

It is to be noted that when the photochromic lens 1-3 reduces the light transmittance, in order not to affect the user's observation of the external environment through the photochromic lens, the light transmittance of the photochromic lens 1-3 is greater than or equal to 20%, but is not limited thereto.

In an exemplary embodiment, the two glasses arms include a first glasses arm and a second glasses arm. A main driving board 1-21 is arranged in the first glasses arm. The main driving board 1-21 is connected to the control portion through a signal connection line 1-17. The main driving board 1-21 is connected to a camera driving board 1-22 of the camera module through a first adapter circuit board 1-24. The camera driving board 1-22 is arranged in the second glasses arm. The main driving board 1-21 is connected to a display drive board of the display module through a second adapter circuit board 1-23.

The eyeglass frame includes a first sub-frame 1-1 and a second sub-frame 1-2 stacked in a light emitting direction of the display module. The first sub-frame 1-1 and the second sub-frame 1-2 are interlocked to form an accommodating cavity. The first adapter circuit board 1-24 and the second adapter circuit board 1-23 are accommodated in the accommodating cavity, and one end of the first adapter circuit board 1-24 extends into the first glasses arm to be connected to the main driving board 1-21, and one end of the second adapter circuit board 1-23 extends into the first glasses arm to be connected to the main driving board 1-21.

In an exemplary embodiment, the glasses frame includes a first sub-frame 1-1 and a second sub-frame 1-2. The first sub-frame 1-1 includes a first main body part for mounting two photochromic lenses 1-3. Two sides along a length direction of the first main body part extend in a direction close to the second sub-frame 1-2 to form a U-shaped connecting groove. Openings of the two U-shaped connecting grooves are arranged opposite to each other. The camera module is fixedly arranged on one side of the length direction of the first sub-frame 1-1 through a camera 1-7 bracket. The camera module further includes a lens 1-26 for protecting the camera 1-7, and the lens 1-26 is located on the side of the first sub-frame 1-1 away from the second sub-frame 1-2. The infrared fill light 1-8 is arranged adjacent to the lens 1-26 of the camera 1-7, and a fill light cover 1-27 is arranged at an outer side of the infrared fill light 1-8 to protect the infrared fill light 1-8.

Exemplarily, the fill light cover 1-27 is made of germanium glass with a specific infrared band.

The illumination sensor 1-12 is arranged in one of the U-shaped connecting grooves, and a light entrance area of the illumination sensor 1-12 is exposed through a through hole in the first sub-frame 1-1 (the through hole is arranged in a side of the first sub-frame 1-1 away from the second sub-frame 1-2). The illumination sensor 1-12 and the camera module are respectively arranged on two sides of the length direction of the front shell.

The second sub-frame 1-2 includes a second main body part corresponding to the first main body part, and an accommodation groove corresponding to the U-shaped connecting groove. The display module is received in the accommodation groove. The display module is fixed to the second sub-frame 1-2 through a display fixing bracket. The first adapter circuit board 1-24, the second adapter circuit board 1-23, the diffraction light waveguide 1-14 and the photochromic lens 1-3 are stacked between the first main body part and the second main body part.

In an exemplary embodiment, each of the glasses arms is pivotally connected to the eyeglass frame via a rotating shaft so that the glasses arms can be flipped around its connection position with the eyeglass frame at a preset angle in a third direction (referring to the Y direction in FIG. 1). The third direction is the length direction of the eyeglass frame.

Exemplarily, the preset angle is 1-10 degrees, but not limited thereto. The rotating shaft allows the glasses arms to flip around the connection position with the eyeglass frame at a preset angle in a third direction, so that the head-mounted display device is suitable for persons with different head widths, and the webbing 1-10 assists in balancing the gravity of the whole device, thereby improving the wearing experience.

The rotating shaft is a hinge-type structure, including a first pivot shaft 1-16 and a second pivot shaft 1-15. The first pivot shaft 1-16 and the second pivot shaft 1-15 are assembled through interference fit to achieve a damping effect with adjustable feel. A first connecting piece of the first pivot shaft 1-16 is connected to the glasses arm, and a first axial hole is provided at one end of the first connecting piece. A second connecting piece of the second pivot shaft 1-15 is connected to the eyeglass frame, and one end of the second connecting piece is provided with two second axial holes spaced apart from each other. The first axial hole is inserted between the two second axial holes for the shaft to extend through the first axial hole and the second axial hole.

In an exemplary embodiment, the glasses arm includes a glasses arm shell 1-4 and a glasses arm cover 1-6. The glasses arm shell 1-4 and the glasses arm cover 1-6 of one glasses arm accommodate the main driving board 1-21; the glasses arm shell 1-4 and the glasses arm cover 1-6 of the other glasses arm accommodate the camera driving board 1-22. The second connecting piece is provided with a through hole, the first adapter circuit board 1-24 extends through the corresponding through hole in the second connecting piece, so that the camera driving board 1-22 is connected to the main driving board 1-21, and the second adapter circuit board 1-23 extends through the corresponding through hole in the second connecting piece, so that the display drive board is connected to the main driving board 1-21.

In an exemplary embodiment, a first elastic buffer pad 1-13 is provided between the glasses arm and the glasses frame. The presence of the first elastic buffer pad 1-13 provides buffer protection for the glasses arm and the glasses frame. The first elastic buffer pad 1-13 is provided with a through hole corresponding to the through hole in the corresponding second connecting piece, thereby allowing the corresponding first adapter circuit board 1-24 or second adapter circuit board 1-23 to pass through.

In an exemplary embodiment, a nose pad 1-11 is provided in the middle of the eyeglass frame. The nose pad 1-11 is U-shaped. The nose pad 1-11 includes a memory alloy bracket and an elastic colloid coated on an outside of the memory alloy bracket, so as to be compatible with persons with different nose bridges.

In an exemplary embodiment, a second elastic buffer pad 1-5 is provided on an inner side of one end of each of the glasses arms away from the glasses frame. The presence of the second elastic buffer pad 1-5 is to buffer clamping force of the glasses arms and improve the comfort of two sides of the wearer's head.

Exemplarily, the head-mounted display portion may be AR glasses.

An assembly process of the head-mounted display portion in this embodiment is as follows.

First, the display substrate 1-19, the diffraction light waveguide 1-14, the display driving board 1-20 and the photochromic lens 1-3 are respectively installed on the display module bracket 1-18 and fixed by glue to form left-eye and right-eye display modules.

Next, the illumination sensor cover, the lens 1-26 of the camera module and the fill light cover 1-27 are respectively installed at corresponding positions of the first sub-frame 1-1 and fixed with glue.

The camera driving board 1-22 is installed on the left glasses arm shell 1-4-1, and the main driving board 1-21 is installed on the right glasses arm shell 1-4-2, and fixed with screws.

The first pivot axis 1-16 and the second pivot axis 1-15 are assembled together to form a left-side rotating axis and a right-side rotating axis respectively, and the rotating axis on both sides are adjust to have a consistent feel.

Then, the second pivot axis 1-15 is correspondingly installed on the first sub-frame 1-1, and the first pivot axis 1-16 is correspondingly installed on the left/right glasses arm shell.

The infrared fill light 1-8 and the camera 1-7 are respectively installed on the camera bracket 1-28 to form a camera module, and the camera module is assembled on the first sub-frame 1-1.

The camera driving board 1-22 and the main driving board 1-21 are connected through the first adapter circuit board 1-24, and the first adapter circuit board 1-24 needs to extend through the corresponding rotating shaft and the first elastic buffer pad 1-13.

The display driving board 1-20 (including the display module on the left and the display module on the right) and the main driving board 1-21 are connected through the second adapter circuit board 1-23. At the same time, the second adapter circuit board 1-23 needs to extend through the corresponding rotating shaft and the corresponding first elastic buffer pad 1-13.

The display module is assembled at the corresponding position of the first sub-frame 1-1, the second adapter circuit board 1-23 and the first adapter circuit board 1-24 are arranged, and the first adapter circuit board and the second adapter circuit board are placed on the top of the first sub-frame 1-1 (i.e., above the photochromic lens).

Type-C cable (i.e., signal cable) extends through the right glasses arm cover 1-6-1 and is installed on the main driver board 1-21.

The whole machine function is debugged, and after the whole machine function is normal, the second sub-frame 1-2 is assembled with the first sub-frame 1-1.

The glasses arm covers 1-6 are installed on the corresponding glasses arm shells respectively.

At the same time, the second elastic buffer pad 1-5, the nose pad 1-11, the webbing fixing knob 1-9 and the webbing 1-10 are installed.

Finally, the head-mounted display portion is assembled.

One embodiment further provides a communication command system, including the above head-mounted display device and a command terminal, and the head-mounted display device and the command terminal are communicatively connected.

The head-mounted display device in this embodiment is mainly used to assist armed police and public security officers in patrolling and on duty, and to deal with special situations (suspicious persons, illegal gatherings, illegal attacks, etc.) in patrol and on-duty areas. It is capable of real-time target identification, action coordination, and special situation upload of moving suspicious persons in daytime and dim light conditions. The superior command organization (i.e., the command terminal) interacts with patrol and on-duty personnel (personnel wearing the head-mounted display device) through audio and video over a public or private 4G/5G communication network, can grasp the patrol and on-duty status in real time, and provide remote technical support and force deployment for special situation handling operations.

The functions of the communication command system in this embodiment include the following points.

Face recognition: it is realized through a series of functions such as face detection, face tracking, face comparison, face search, and recognition result output. The user (personnel using head-mounted display devices) identifies persons within 8-10 meters during patrol duty, and automatically identifies the identity of suspicious persons without alerting the other party based on target recognition technology, automatically screens the target persons, and then handles or reports according to the plan (reports to the command terminal).

Real-time recording: real-time recording of audio and video during patrol duty for disposal action evaluation and evidence preservation.

Visual dispatch: the superior agency can grasp the on-site situation and various special situations through the command terminal based on the audio and video information uploaded by the patrol personnel (the personnel wearing the head-mounted display device), and provide real-time dispatch and remote technical support according to the level of the special situation and the corresponding disposal plan.

A use process of the communication command system in this embodiment is as follows:

connecting the head-mounted display portion and the control portion with a Type-C data cable (i.e., signal connection cable); after wearing it accordingly, short pressing a power switch button to turn it on; after turning it on, entering an operation-state; after the operation is completed, long pressing the power switch button to turn it off.

Figure 16:
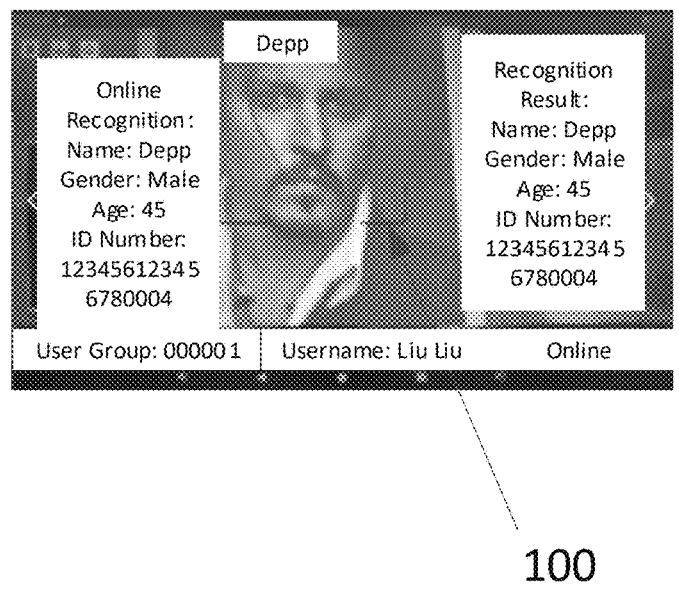
FIG. 16 is a schematic diagram showing image information seen by a user when performing face recognition.

During operation, the head-mounted display portion can identify facial information of persons within a range of ten meters (but not limited to this), and compare it with the database information. When an identified object is outside the suspect database, it will be displayed as a green stranger; when the identified object is data in the suspect database, it will be displayed in red with detailed information. FIG. 16 is a schematic diagram showing image information seen by the user during face recognition. The dotted frame 100 around the face will display the corresponding color according to attributes of the identified object (including whether it is a suspect).

After identifying the target, pressing a screenshot button on the front of the main housing to transmit a captured image to the backend. The backend issues instructions through the voice system based on the actual situation, and the front desk staff (i.e. the staff using the head-mounted display device) take actions according to the instructions.

The wearer can use voice commands to operate and enter the voice control mode through the wake-up word. In the voice control mode, if no command is heard within a preset time (for example, 5 seconds), the voice control mode is exited and needs to be re-awakened.

Voice command operations include: screenshot, exit image, volume up, volume down, log upload, etc.

An administrator enters a log maintenance management interface. The system log includes: system startup, system exit, start recording, stop recording, screenshot upload, log upload, room login, room switch. The administrator can view, download and clear the server log in the log management interface.

It is to be understood that the above embodiments are merely exemplary embodiments used to illustrate the principles of the present disclosure, but the present disclosure is not limited thereto. For those skilled in the art, several improvements and modifications can be made without departing from the principles described in the present disclosure. These improvements and modifications should also be regarded as falling in the protection scope of the present disclosure.

What is claimed is:

1. A head-mounted display device, comprising a head-mounted display portion and a control portion connected to the head-mounted display portion by signal, wherein:

the control portion includes a main battery, an auxiliary battery, and a switching circuit module connected to the main battery and the auxiliary battery; and the switching circuit module is used to switch power supply between the main battery and the auxiliary battery;

the switching circuit module includes a first trigger connector and a second trigger connector having a first state and a second state; in the first state, the first trigger connector and the second trigger connector are in an off-state, and the main battery supplies power; in the second state, the first trigger connector and the second trigger connector are in an on-state to trigger a switching signal to switch to the auxiliary battery for power supply;

the head-mounted display portion includes a head-mounted bracket, a display module and a camera module located in the head-mounted bracket;

the head-mounted bracket includes a glasses frame, two glasses arms, and a webbing connected between ends of the two glasses arms away from the glasses frame;

the two glasses arms include a first glasses arm and a second glasses arm; a main driving board is arranged in the first glasses arm; the main driving board is connected to the control portion through a signal connection line; the main driving board is connected to a camera driving board of the camera module through a first adapter circuit board; the camera driving board is arranged in the second glasses arm; the main driving board is connected to a display drive board of the display module through a second adapter circuit board; and the eyeglass frame includes a first sub-frame and a second sub-frame stacked in a light emitting direction of the display module; the first sub-frame and the second sub-frame are interlocked to form an accommodating cavity; the first adapter circuit board and the second adapter circuit board are accommodated in the accommodating cavity, and one end of the first adapter circuit board extends into the first glasses arm to be connected to the main driving board, and one end of the second adapter circuit board extends into the first glasses arm to be connected to the main driving board.

2. The device according to claim 1, wherein the switching circuit module includes an execution module, the first trigger connector and the second trigger connector; the main battery and the auxiliary battery are electrically connected to a power supply module of the control portion through the execution module, and the first trigger connector is connected to the power supply module of the control portion;

in the second state, the second trigger connector is electrically connected with the first trigger connector to trigger a switching signal for switching the power supply from the main battery to the auxiliary battery;

according to the switching signal, the power supply module sends a command to the execution module to perform power switching.

3. The device according to claim 2, wherein the control portion includes a main housing and a battery compartment housing for accommodating the main battery and the auxiliary battery;

the switching circuit module includes a switching circuit board, and the execution module is integrated on the switching circuit board;

the first trigger connector includes an anti-foolproof switch, and the anti-foolproof switch is arranged in the main housing;

the second trigger connector includes a battery block and a conductive metal sheet; the battery block is movably connected to a through hole of a side wall of the battery compartment housing on a side close to the main housing; the conductive metal sheet is arranged on a side of the battery block close to the main housing;

under action of external force, the battery block moves toward a direction close to the anti-foolproof switch, thereby enabling the conductive metal sheet to be electrically connected to the anti-foolproof switch to trigger the switching signal that switches the power supply from the main battery to the auxiliary battery.

4. The device according to claim 3, wherein the second trigger connector further includes a reset spring; the battery block is elastically connected to the main housing through the reset spring, and part of the battery block extends through the through hole in the battery compartment housing and is accommodated in the battery compartment housing; an orthographic projection of the conductive metal sheet onto the main housing at least partially covers the anti-foolproof switch.

5. The device according to claim 3, wherein the battery compartment housing includes a first shell and a first cover plate that are engaged with each other to form a battery compartment; the main battery and the auxiliary battery are arranged in the battery compartment along a first direction;

the through hole is defined in the first cover plate; in the first direction, the battery block is arranged on a side of the main battery away from the auxiliary battery.

6. The device according to claim 5, wherein in a second direction perpendicular to the first direction, the first cover plate has two opposite side edges, at least one of the side edges is provided with a reinforcing plate, and the reinforcing plate is arranged perpendicular to the first cover plate.

7. The device according to claim 5, wherein the first shell includes a first sub-shell and a second sub-shell; the first sub-shell is fixedly connected to the first cover plate; the second sub-shell is movably connected to the first sub-shell and the first cover plate.

8. The device according to claim 3, wherein the main housing includes a second shell and a second cover plate that are engaged with each other to form a receiving cavity;

a side wall of the second shell is provided with a plug interface for connecting to a signal connection line of the head-mounted display portion;

and/or, the side wall is provided with a volume button, a power switch button and a subscriber identification module (SIM) card installation slot;

and/or, a touch area is provided on an operation surface of the second shell away from the second cover plate;

and/or, the side wall or the operation surface is provided with an operation indicator light;

and/or, the side wall or the operation surface is provided with function selection buttons.

9. The device according to claim 1, wherein the camera module includes:

a camera with an RGB camera mode and an IR camera mode;

an illumination sensor for detecting external ambient light intensity;

a processor used to select corresponding RGB camera mode or IR camera mode according to a light intensity detected by the illumination sensor.

10. The device according to claim 9, wherein the camera module further includes: an infrared fill light for performing infrared fill light in the IR camera mode.

11. The device according to claim 1, wherein the head-mounted display portion further includes a diffraction light waveguide arranged in a light-emitting layer of the display module to form a viewpoint entering the pupil of the human eye, and the diffraction light waveguide is arranged in the glasses frame.

12. The device according to claim 11, wherein the head-mounted display portion further includes a photochromic lens; the photochromic lens is arranged on a side of the diffraction optical waveguide away from the display module; the photochromic lens includes a first transparent conductive layer, an electrochromic material and a second transparent conductive layer stacked on each other; light transmittance of the electrochromic material changes with changing of a voltage applied to the first conductive layer and the second conductive layer.

13. The device according to claim 1, wherein each of the glasses arms is pivotally connected to the eyeglass frame via a rotating shaft, thereby enabling the glasses arms to be flipped around a connection position between each of the glasses arms and the eyeglass frame at a preset angle in a third direction; the third direction is a length direction of the eyeglass frame.

14. The device according to claim 1, wherein a nose pad is provided in a middle of the eyeglass frame; the nose pad is U-shaped; the nose pad includes a memory alloy bracket and an elastic colloid coated on an outside of the memory alloy bracket.

15. A communication command system, comprising a head-mounted display device and a command terminal, wherein:

the head-mounted display device and the command terminal are communicatively connected;

the head-mounted display device includes: a head-mounted display portion and a control portion connected to the head-mounted display portion by signal;

the control portion includes a main battery, an auxiliary battery, and a switching circuit module connected to the main battery and the auxiliary battery; and the switching circuit module is used to switch power supply between the main battery and the auxiliary battery;

the switching circuit module includes a first trigger connector and a second trigger connector having a first state and a second state; in the first state, the first trigger connector and the second trigger connector are in an off-state, and the main battery supplies power; in the second state, the first trigger connector and the second trigger connector are in an on-state to trigger a switching signal to switch to the auxiliary battery for power supply;

the head-mounted display portion includes a head-mounted bracket, a display module and a camera module located in the head-mounted bracket;

the head-mounted bracket includes a glasses frame, two glasses arms, and a webbing connected between ends of the two glasses arms away from the glasses frame;

the two glasses arms include a first glasses arm and a second glasses arm; a main driving board is arranged in the first glasses arm; the main driving board is connected to the control portion through a signal connection line; the main driving board is connected to a camera driving board of the camera module through a first adapter circuit board; the camera driving board is arranged in the second glasses arm; the main driving board is connected to a display drive board of the display module through a second adapter circuit board; and the eyeglass frame includes a first sub-frame and a second sub-frame stacked in a light emitting direction of the display module; the first sub-frame and the second sub-frame are interlocked to form an accommodating cavity; the first adapter circuit board and the second adapter circuit board are accommodated in the accommodating cavity, and one end of the first adapter circuit board extends into the first glasses arm to be connected to the main driving board, and one end of the second adapter circuit board extends into the first glasses arm to be connected to the main driving board.

16. The communication command system according to claim 15, wherein the switching circuit module includes an execution module, the first trigger connector and the second trigger connector; the main battery and the auxiliary battery are electrically connected to a power supply module of the control portion through the execution module, and the first trigger connector is connected to the power supply module of the control portion;

in the second state, the second trigger connector is electrically connected with the first trigger connector to trigger a switching signal for switching the power supply from the main battery to the auxiliary battery; according to the switching signal, the power supply module sends a command to the execution module to perform power switching.

17. The communication command system according to claim 16, wherein the control portion includes a main housing and a battery compartment housing for accommodating the main battery and the auxiliary battery;

the switching circuit module includes a switching circuit board, and the execution module is integrated on the switching circuit board;

the first trigger connector includes an anti-foolproof switch, and the anti-foolproof switch is arranged in the main housing;

the second trigger connector includes a battery block and a conductive metal sheet; the battery block is movably connected to a through hole of a side wall of the battery compartment housing on a side close to the main housing; the conductive metal sheet is arranged on a side of the battery block close to the main housing;

under action of external force, the battery block moves toward a direction close to the anti-foolproof switch, thereby enabling the conductive metal sheet to be electrically connected to the anti-foolproof switch to trigger the switching signal that switches the power supply from the main battery to the auxiliary battery.

18. The communication command system according to claim 17, wherein the second trigger connector further includes a reset spring; the battery block is elastically connected to the main housing through the reset spring, and part of the battery block extends through the through hole in the battery compartment housing and is accommodated in the battery compartment housing; an orthographic projection of the conductive metal sheet onto the main housing at least partially covers the anti-foolproof switch.

* * * * *